US009613940B2

(12) United States Patent  (10) Patent No.: US 9,613,940 B2
Yu  (45) Date of Patent: Apr. 4, 2017

(54) CARRIER ARRAY AND LIGHT EMITTING DIODE PACKAGE

(71) Applicant: INGENII TECHNOLOGIES CORPORATION, Hsinchu County (TW)

(72) Inventor: Cheng-Ta Yu, Hsinchu County (TW)

(73) Assignee: INGENII TECHNOLOGIES CORPORATION, Hsinchu County (TW)

( * ) Notice: Subject to any disclaimer, the term of this patent is extended or adjusted under 35 U.S.C. 154(b) by 0 days.

(21) Appl. No.: 14/979,527

(22) Filed: Dec. 28, 2015

(65) Prior Publication Data

US 2016/0190112 A1    Jun. 30, 2016

Related U.S. Application Data

(60) Provisional application No. 62/098,314, filed on Dec. 30, 2014.

(30) Foreign Application Priority Data

Feb. 26, 2015    (TW) .............................. 104106341 A

(51) Int. Cl.
*H01L 25/16* (2006.01)
*H01L 33/54* (2010.01)
(Continued)

(52) U.S. Cl.
CPC ............ *H01L 25/167* (2013.01); *H01L 23/00* (2013.01); *H01L 33/54* (2013.01);
(Continued)

(58) Field of Classification Search
CPC ..... H01L 2924/181; H01L 2224/48247; H01L 2224/48465; H01L 24/97;
(Continued)

(56) References Cited

U.S. PATENT DOCUMENTS

2009/0230413 A1*  9/2009  Kobayakawa ........ H01L 33/483
                                                    257/91
2011/0186901 A1*  8/2011  Ushiyama ............... H01L 33/48
                                                    257/99
(Continued)

*Primary Examiner* — Thomas L Dickey
*Assistant Examiner* — Changhyun Yi
(74) *Attorney, Agent, or Firm* — Jianq Chyun IP Office

(57) ABSTRACT

A carrier array adapted for carrying a plurality of chips is provided. The carrier array includes a lead frame, controllers and first packages. The lead frame includes a frame body and a plurality of lead frame units. The lead frame units are connected with each other through the frame body and arranged in an array. Each of the lead frame units includes at least one first pin connected with the frame body and a plurality of second pins not connected with the frame body. The controllers are disposed on the lead frame units, and electrically connected with the corresponding lead frame units, respectively. Each of the first packages is disposed on the lead frame, and respectively has an opening to expose a portion region of the corresponding lead frame unit, and the openings are adapted for accommodating the chips. A light emitting diode package is also provided.

12 Claims, 5 Drawing Sheets

(51) Int. Cl.
*H01L 33/62* (2010.01)
*H01L 23/00* (2006.01)

(52) U.S. Cl.
CPC ............ *H01L 2224/05554* (2013.01); *H01L 2224/48091* (2013.01); *H01L 2224/97* (2013.01); *H01L 2924/181* (2013.01)

(58) Field of Classification Search
CPC ....... H01L 2224/48091; H01L 21/4842; H01L 2933/0066; H01L 23/49541; H01L 33/62; H01L 25/167; H01L 33/504; H01L 33/52; H01L 27/15
USPC ............................................ 257/99; 438/123
See application file for complete search history.

(56) References Cited

U.S. PATENT DOCUMENTS

| | | | | |
|---|---|---|---|---|
| 2013/0001599 A1* | 1/2013 | Lee | ........................ | H01L 25/167 257/88 |
| 2015/0034998 A1* | 2/2015 | Nakabayashi | .......... | H01L 24/97 257/99 |
| 2015/0207049 A1* | 7/2015 | Ko | ........................ | H01L 25/167 257/98 |

* cited by examiner

CARRIER ARRAY AND LIGHT EMITTING DIODE PACKAGE

CROSS-REFERENCE TO RELATED APPLICATION

This application claims the priority benefits of U.S. provisional application Ser. No. 62/098,314, filed on Dec. 30, 2014 and Taiwan application serial no. 104106341, filed on Feb. 26, 2015. The entirety of each of the above-mentioned patent applications is hereby incorporated by reference herein and made a part of this specification.

BACKGROUND OF THE INVENTION

1. Field of the Invention

The invention relates to a carrier array and a light emitting diode package structure, and particularly relates to a carrier array and a light emitting diode package structure having a plurality of pins separated from each other.

2. Description of Related Art

In the semiconductor industry, the production of integrated circuits (ICs) can be mainly divided into three stages, which are IC design, IC process and IC package. In the IC process, a die is manufactured through the processes including manufacturing a wafer, forming an IC, electrical testing, and wafer sawing, etc.

Generally speaking, an electrical testing process is required in various stages in semiconductor manufacturing processes to ensure each die has a normal electrical function, so as to form a suitable integrated circuit together with a lead frame in subsequent wafer-separating and packaging processes.

However, when an IC is designed, the lead frame for carrying the die may also have different electrical properties. Under such circumstance, if the die that is arbitrarily chosen is bonded to the lead frame, the yield rate of the subsequent processes may be affected.

SUMMARY OF THE INVENTION

The invention provides a carrier array, where lead frames may be graded based on electrical properties of the lead frames.

The invention provides a light emitting diode package structure having a preferable manufacturing yield rate.

A carrier array according to an embodiment of the invention is adapted for carrying a plurality of chips. The carrier array includes a lead frame, a plurality of controllers, and a plurality of packages. The lead frame includes a frame body and a plurality of lead frame units. The lead frame units are connected with each other through the frame body and arranged in an array. Each of the lead frame units includes at least one first pin connected with the frame body and a plurality of second pins separated from each other, and the second pins are not connected with the frame body. The controllers are disposed on the lead frame units. In addition, each of the controllers is electrically connected with one of the lead frame unit correspondingly. The first packages are disposed on the lead frame. In addition, the first packages correspond to and encapsulate the lead frame units. Moreover, each of the first packages has an opening to expose a portion region of the corresponding lead frame unit, and the openings are adapted to accommodate the chips.

An embodiment of the invention provides a light emitting diode package structure, including a lead frame unit, at least one controller, a first package, and at least one chip. The lead frame unit includes at least one first pin and a plurality of second pins separated from each other. The at least one controller is disposed on the lead frame unit. In addition, the at least one controller is electrically connected with the second pins of the lead frame unit. The first package is disposed on the lead frame unit. In addition, the first package encapsulates the lead frame unit and the at least one controller, and the first package has an opening to expose a portion region of the lead frame unit. The at least one chip is disposed in the opening. Moreover, the at least one chip is electrically connected with the at least one first pin of the lead frame unit. For example, the light emitting diode package structure may further includes a second package and the second package is disposed in the opening and encapsulates the chip.

According to an embodiment of the invention, each of the first packages encapsulates a portion region of the corresponding second pins, and the second pins are fixed on the frame body through the first packages.

According to an embodiment of the invention, the second pins of each lead frame unit extend from inside of the corresponding first package to outside of the corresponding first package and are exposed by the opening.

According to an embodiment of the invention, the second pins of each lead frame unit are floated in the corresponding first package.

According to an embodiment of the invention, the carrier array further includes a plurality of bonding wires. In addition, the controllers are electrically connected with at least a part of the second pins through the bonding wires.

According to an embodiment of the invention, the carrier array further includes a plurality of conductive bumps. In addition, the controllers are electrically connected with at least a part of the second pins through the conductive bumps.

According to an embodiment of the invention, each of the chips is electrically connected with one of the lead frame unit correspondingly, and the carrier array further includes a plurality of second packages. Each of the second packages are respectively disposed in one the openings and encapsulate one of the chips.

Based on above, with the second pins electrically separated from each other, the lead frame unit according to the embodiments of the invention is suitable for electrical testing to grade the lead frame units carrying the controllers. Thus, the electrical property of each of the lead frame units carrying the controllers in the lead frame may be properly evaluated and selected, so that the lead frame units may be used with the suitable chips based on practical needs to thereby improve the yield rate of the subsequent processes.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
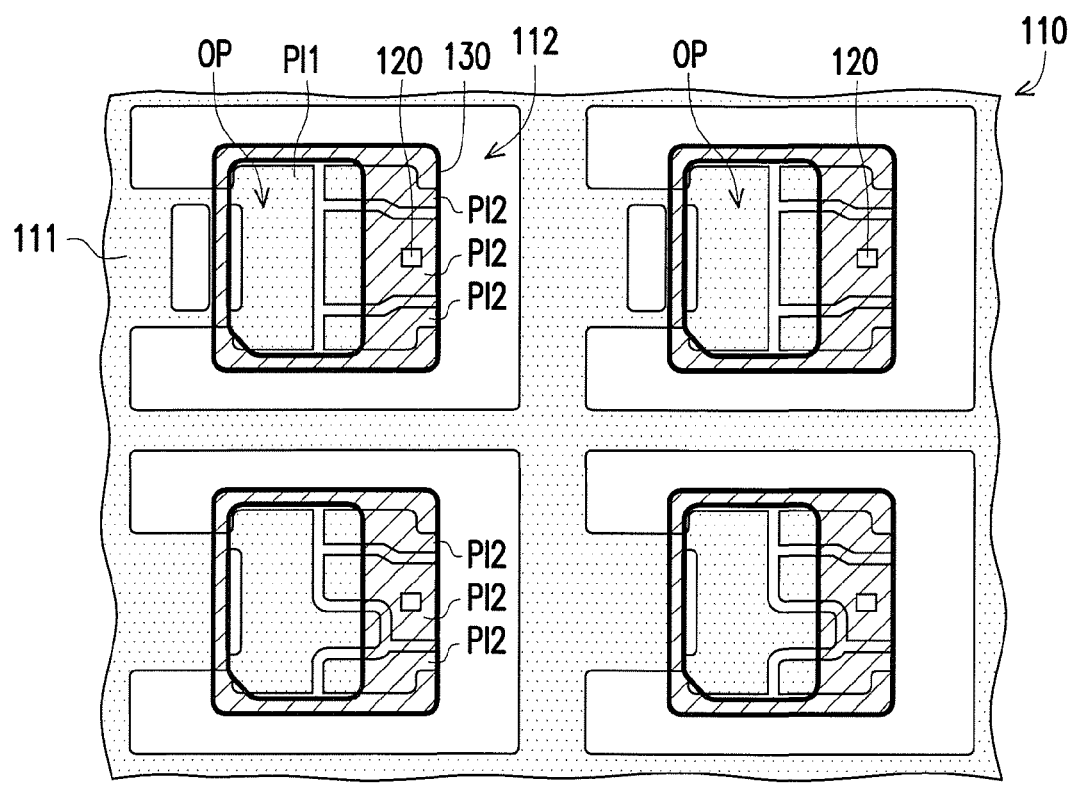
FIG. 1 is a schematic view illustrating a carrier array according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
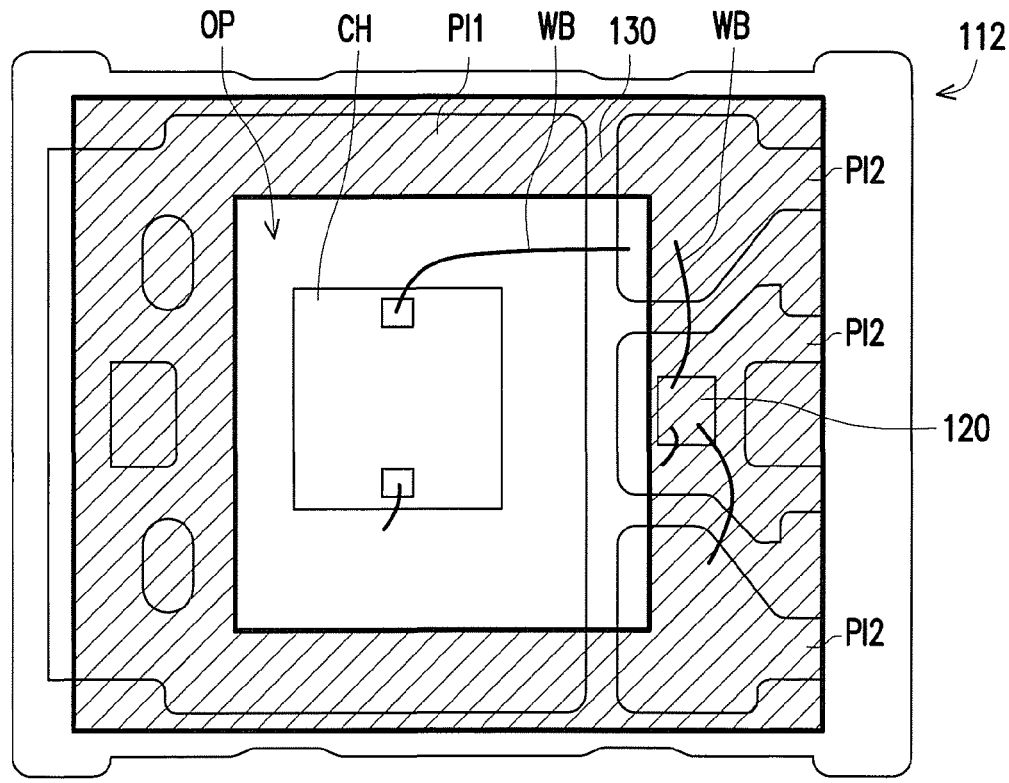
FIG. 2A is a schematic view illustrating a lead frame unit of FIG. 1.
Figure 2B:
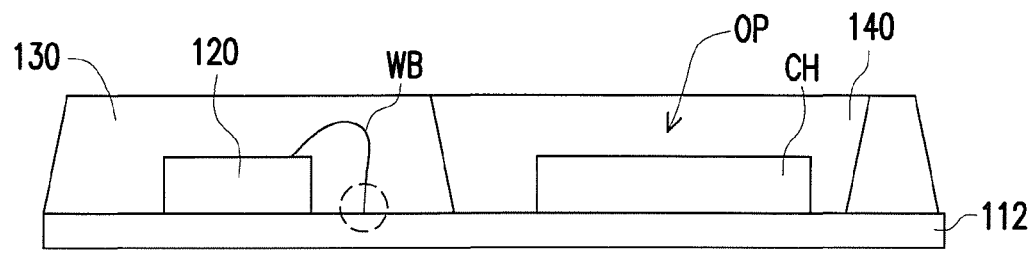
FIG. 2B is a schematic side view of the lead frame unit of FIG. 2A.

FIG. 1 is a schematic view illustrating a carrier array according to an embodiment of the invention. FIG. 2A is a schematic view illustrating a lead frame unit of FIG. 1. FIG. 2B is a schematic side view of the lead frame unit of FIG. 2A. Referring to FIGS. 1 and 2A, a carrier array 100 of this embodiment is adapted to carry a plurality of chips CH. The chips CH described herein may be light emitting diodes, for example. However, the invention is not limited thereto. Specifically, as shown in FIG. 1, the carrier array 100 includes a lead frame 110, a plurality of controllers 120, and a plurality of first packages 130. The lead frame 110 includes a frame body 111 and a plurality of lead frame units 112. The lead frame units 112 are connected with each other through the frame body 111 and arranged in an array. Each of the lead frame units 112 includes at least one first pin PI1 connected with the frame body 111 and a plurality of second pins PI2 separated from each other. In addition, the second pins PI2 are not connected with the frame body 111.

Specifically, as shown in FIGS. 1 and 2A, the controllers 120 are disposed on the lead frame units 112, and each of the controllers 120 is electrically connected with the corresponding lead frame unit 112. More specifically, in this embodiment, the carrier array 110 further includes a plurality of bonding wires WB. The controller 120 is electrically connected with at least a part of the second pins PI2 through the bonding wires WB. As shown in FIG. 2B, in this embodiment, the bonding wires WB may be formed by performing a wiring process, and the controller 120 is electrically connected with at least a part of the second pins PI2 through the bonding wires WB. To be more specific, a process of forming the bonding wire WB includes soldering one end of the bonding wire WB to the lead frame 110, dragging a wiring material above the controller 120 by a wiring machine, and then soldering the other end of the bonding wire WB to the controller 120. Since a height of the bonding wire WB formed in such process is only slightly greater than a thickness of the controller 120, the first package 130 formed subsequently may be thinner.

More specifically, as shown in FIGS. 1 and 2B, the first package 130 is disposed on the lead frame 110. Besides, the packages 130 correspond to the lead frame units 112 and encapsulate the controllers 120 and the lead frame units 112. Specifically, the first package 130 encapsulates a portion region of each of the second pins PI2. Since the second pins PI2 are not connected with the frame body 111, relative positions between the second pins and the frame body 111 are only maintained through the first package 130, and the second pins PI2 are fixed on the frame body 111 through the first package 130. In other words, the second pins PI2 are in a floating state in the first package 130 and are not connected with the frame body 111. Besides, as shown in FIGS. 1 and 2B, each of the first packages 130 has an opening OP to expose a portion region of the corresponding lead frame unit 112. In addition, the openings OP are suitable to accommodate the chips CH, as shown in FIG. 2B. Moreover, as shown in FIG. 2B, in this embodiment, a second package 140 may be optionally formed at the chip CH to encapsulate the chip CH and thereby form a light emitting diode package structure 200.

More specifically, in this embodiment, since the second pins PI2 of the lead frame unit 112 are separated from each other and not connected with the frame body 111, as shown in FIG. 1, the lead frame units 112 are suitable for electrical testing to grade the lead frame units 112 carrying the controllers 120. For example, in this embodiment, a suitable voltage and/or current may be applied to each of the lead frame units 112 carrying the controllers 120, and results of electrical testing may be recorded. Based on the results of the electrical testing, the lead frame units 112 carrying the controllers 120 are graded. In this way, an electrical property of each of the lead frame units 112 of the lead frame 110 may be properly evaluated and selected, so that the lead frame units 112 may be used with the suitable chips CH based on practical needs to thereby improve a yield rate in subsequent processes.

Furthermore, in this embodiment, an external resistance may be optionally connected by choosing different types of the controllers 120, and different circuit designs may be employed, so as to adjust an intensity of an output current to thereby adjust a light output of the chip CH. In the following, further details will be provided with reference to FIGS. 2C to 2D.

Figure 2C:
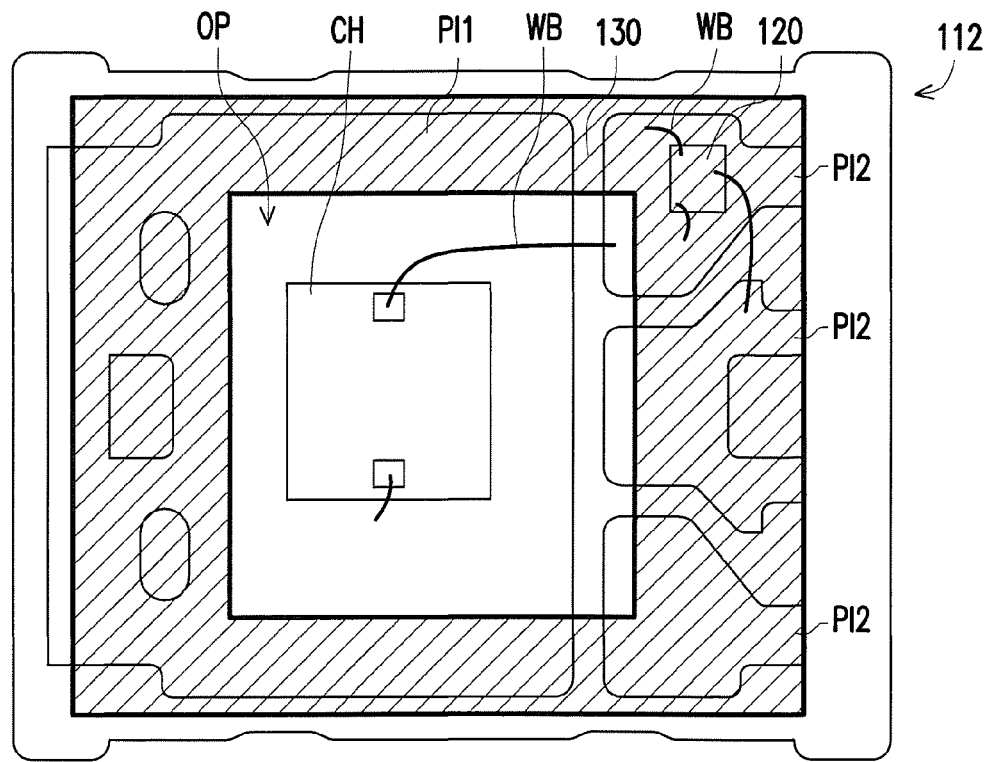
FIGS. 2C and 2D are schematic views illustrating different lead frame units of FIG. 1.
Figure 2D:
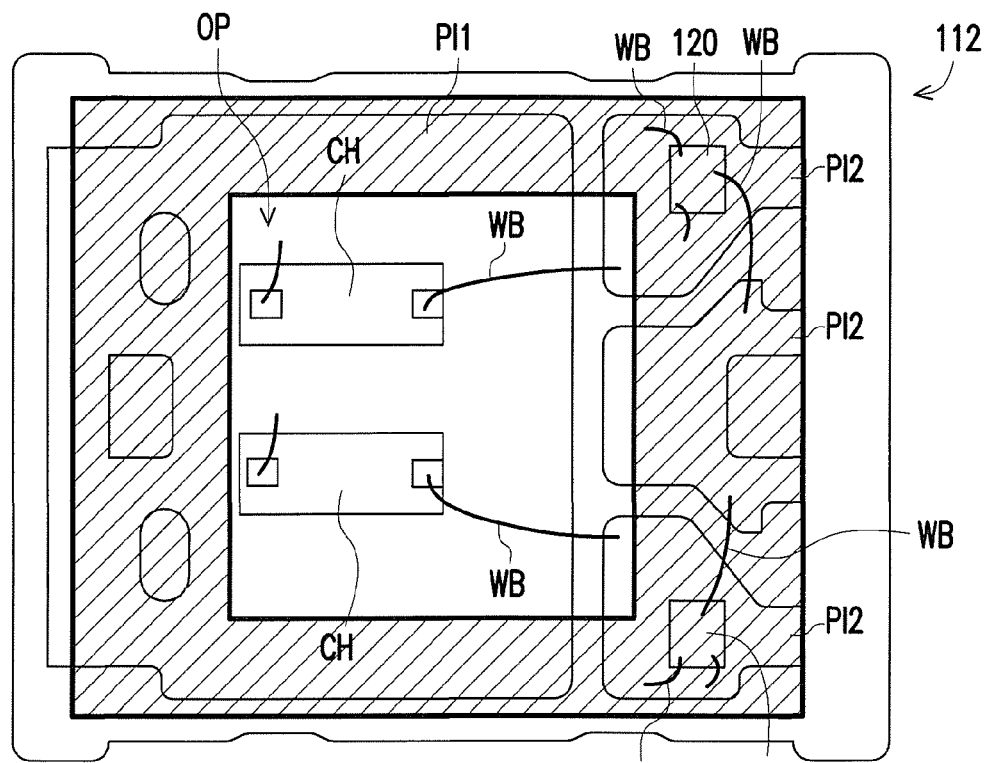

FIGS. 2C and 2D are schematic views illustrating other lead frame units of FIG. 1. Specifically, in the embodiment of FIG. 2A, the controller 120 may be electrically connected with the second pins PI2 through the bonding wires WB, and when the chip CH is disposed on the lead frame unit 112, the chip CH may be electrically connected with the first pin PI1 and the second pins PI2 through the bonding wires WB. In the embodiment of FIG. 2C, the controller 120 is electrically connected with the second pins PI2 through the bonding wires WB, and when the chip CH is disposed on the lead frame unit 112, the chip CH may be electrically connected with the first pin PI1 and the second pins PI2 through the bonding wires WB.

In the embodiment of FIG. 2C, the controller 120 may output a constant current when being applied with a constant voltage. As for the embodiment in FIG. 2A, a suitable voltage and/or current may be applied to the controller 120 to adjust the intensity of the output current through the second pins PI2 connected with the external resistance. For example, in the embodiments shown in FIGS. 2A and 2C, the controller 120 is suitable to be applied with a DC voltage, and a voltage that the controller 120 is capable of carrying is about 15 volts. It should be noted that the numerical value recited herein merely serves as an exemplary purpose and shall not be construed as a limitation of the invention.

In addition, in the embodiments shown in FIGS. 2A and 2C, the number of the chip CH carried by each of the lead frame units 112 is described as one. However, the invention is not limited thereto. In the embodiment of FIG. 2D, the number of the chip CH carried by each of the lead frame units 112 is plural, and the number of the controller 120 is also plural (two in FIG. 2D as an example). In addition, the controllers 120 may be electrically connected with the second pins PI2 through the bonding wires WB, and the chips CH are electrically connected with the first pin PI1 and the second pins PI2 through the bonding wires WB.

FIGS. 3A to 3D are schematic views illustrating different lead frame units according to other embodiments of the invention. Lead frame units 312a, 312b, 312c and 312d shown in FIGS. 3A to 3D are similar to the lead frame unit 112 in FIG. 2A. Thus, only the differences between the lead frame units 312a, 312b, 312c and 312d and the lead frame unit 112 are described in the following. Referring to FIGS. 3A to 3D, in the embodiments shown in FIGS. 3A to 3D, the second pins PI2 of the lead frame units 312a, 312b, 312c and 312d extend from inside of the first package 130 to outside of the first package 130, so as to be exposed by the opening OP. More specifically, as shown in FIGS. 3A to 3D, since the second pins PI2 of the lead frame units 312a, 312b, 312c, and 312d are also electrically separated from each other, the lead frame units 312a, 312b, 312c, and 312d are also suitable for electrical testing to grade the lead frame units 312a 312b, 312c, and 312d carrying the controllers 120. Accordingly, an electrical property of each of the lead frame units 312a, 312b, 312c, and 312d may also be properly evaluated and selected to be used with the suitable chips CH based on practical needs when forming a structure similar to the carrier array 110, so as to improve a yield rate of subsequent processes and accomplish the properties in the foregoing embodiments. Thus, details in this respect are not repeated in the following.

Moreover, in the embodiment shown in FIGS. 3A to 3D, each of the lead frame units 312a, 312b, 312c, and 312d further includes a heat sink 360. In addition, the first package 130 encapsulates the heat sink 360, and the heat sink 360 is exposed by the opening OP of the first package 130. When the chip CH is disposed on the heat sink 360, heat generated when the chip CH is being operated is dissipated in a higher efficiency, so as to suppress rising of a temperature of the chip CH.

Figure 3A:
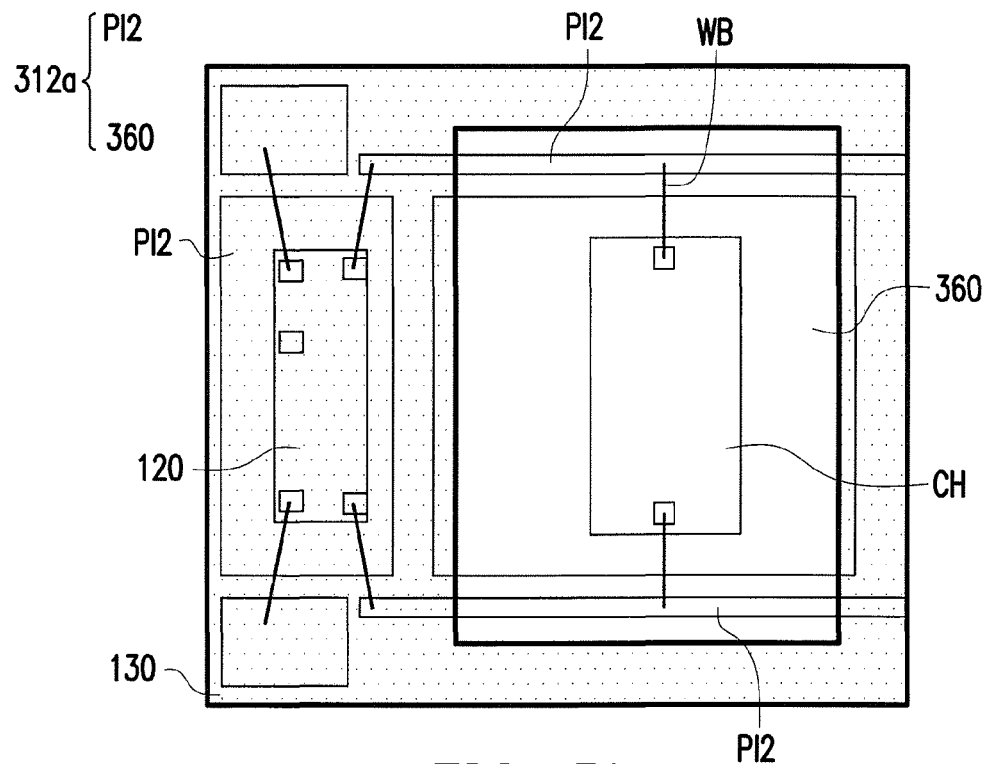
FIGS. 3A to 3D are schematic views illustrating different lead frame units according to other embodiments of the invention.
Figure 3B:
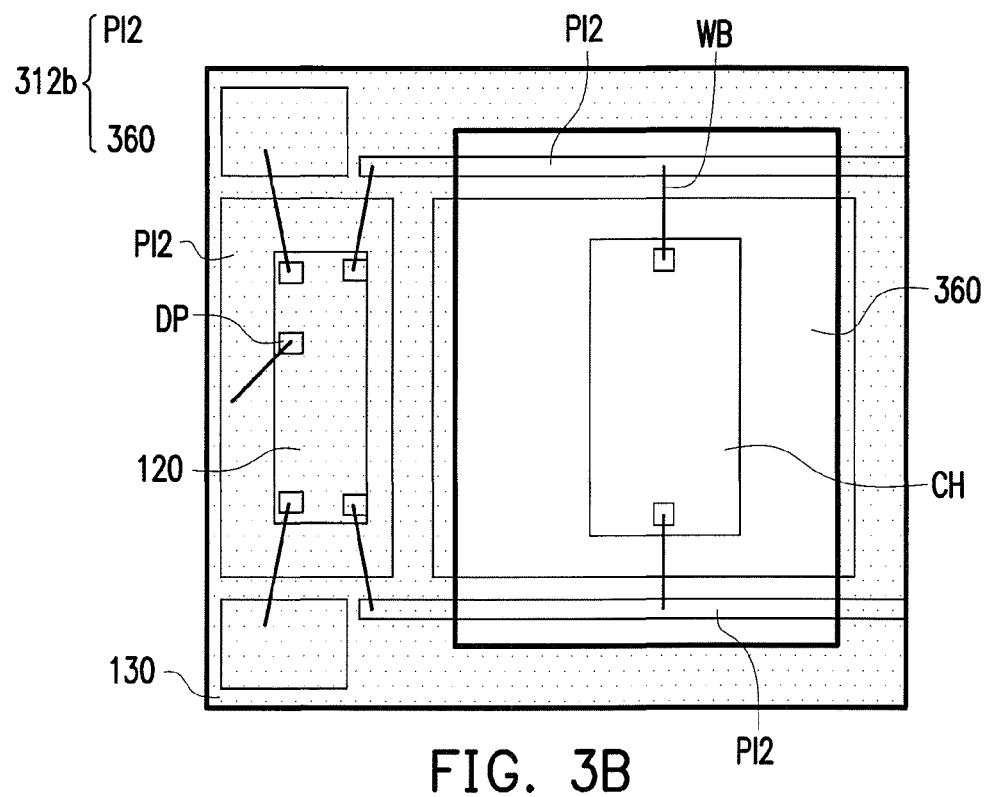

In addition, in the embodiment shown in FIGS. 3A to 3D, the lead frame units 312a, 312b, 312c, and 312d may be used with different circuit structure designs, so as to be adjustable to different types of the controllers 120. For example, as shown in FIGS. 3A and 3B, the controller 120 may be electrically connected with the second pins PI2 through the bonding wires WB, and when the chip CH is disposed on the heat sink 360, the chip CH may also be electrically connected with second pins PI2 through the bonding wires WB. Thus, in the embodiment shown in FIGS. 3A and 3B, the controller 120 is suitable to be applied with a DC voltage and a range of the voltage that the controller 120 is capable of carrying is wider (e.g., greater than 40 volts). It should be noted that the numerical value recited herein merely serves as an exemplary purpose and shall not be construed as a limitation of the invention.

Figure 3C:
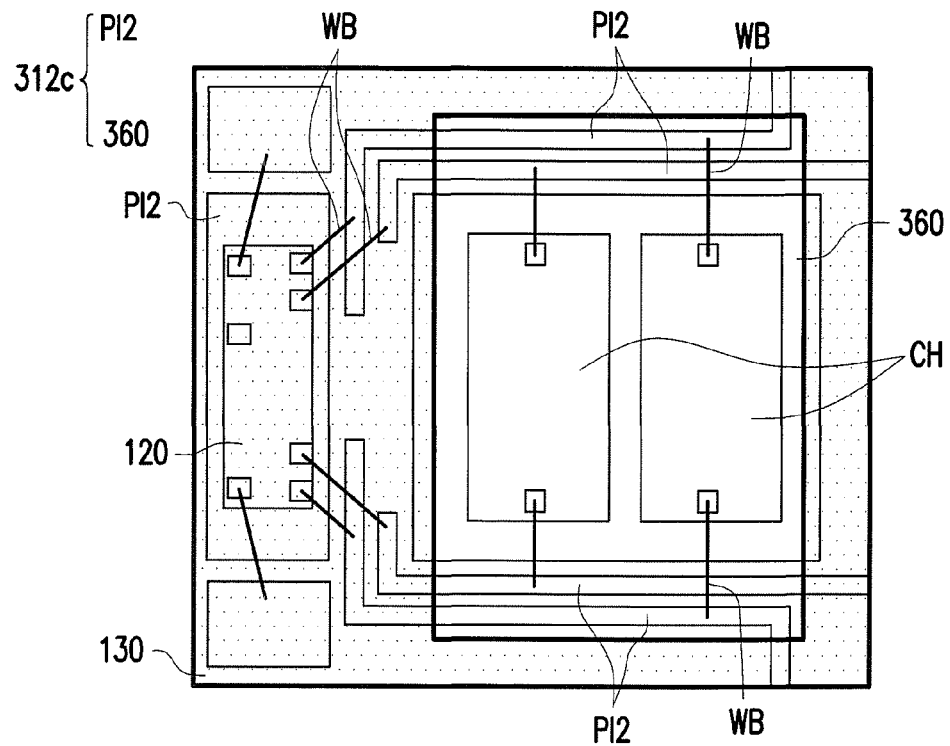
Figure 3D:
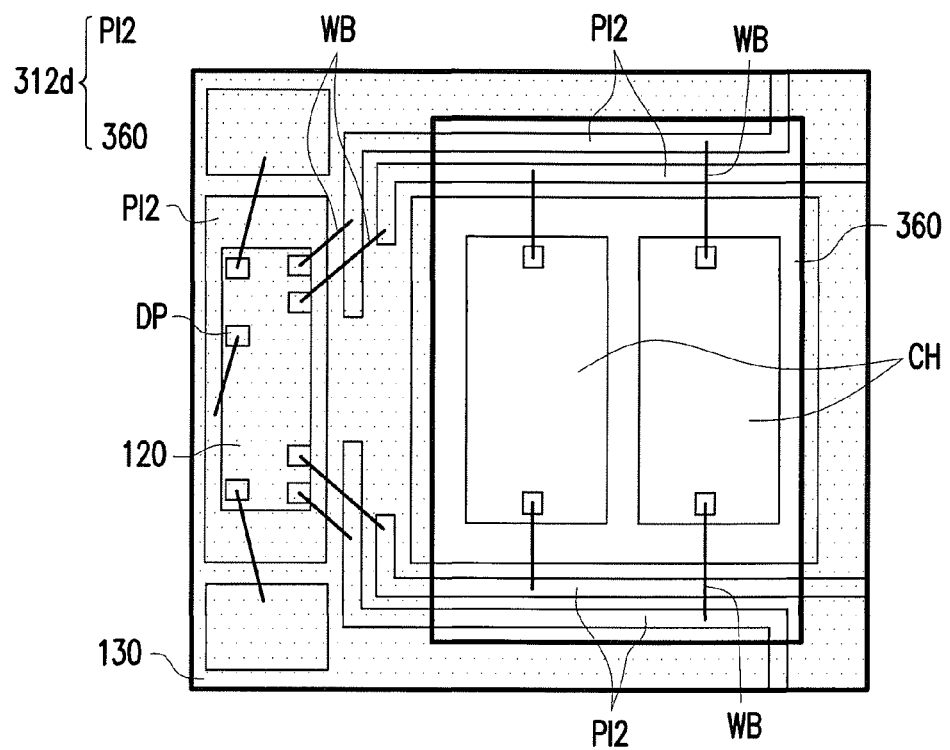

Besides, in the embodiments shown in FIGS. 3A and 3B, the number of the chip CH carried by each of the lead frame units 312a and 312b is described as one. However, the invention is not limited thereto. As shown in FIGS. 3C and 3D, the number of the chip CH carried by each of the lead frame units 312c and 312d is plural, and the number of the controller 120 is also plural (illustrated as two in FIGS. 3C and 3D as an example). In addition, the controllers 120 may be electrically connected with the second pins PI2 through the bonding wires WB, and the chips CH are electrically connected with the second pins PI2 through the bonding wires WB. For example, in the embodiments shown in FIGS. 3C and 3D, the controller 120 is suitable to be applied with an AC voltage, and a voltage that the controller 120 is capable of carrying is about 40 volts. Alternatively, a controller capable of carrying a wider range of the voltage may also be chosen and used as the controller 120. For example, a maximum voltage that the controller 120 is capable of carrying is in a range from 12 volts to 72 volts. It should be noted that the numerical value recited herein merely serves as an exemplary purpose and shall not be construed as a limitation of the invention.

Also, in the embodiments of FIGS. 3A and 3C, the controller 120 may output a constant current when being applied with a constant voltage. As for the embodiments in FIGS. 3B and 3D, a suitable voltage and/or current may be applied to the controller 120 to adjust an intensity of an output current through a pad DP connected with an external resistance.

Also, it should be noted that, in the embodiments, even though the controller 120 is described as being electrically connected with at least a part of the second pins PI2 through the bonding wires WB, the invention is not limited thereto. In another embodiment not shown herein, the controller 120 may also be electrically connected with at least a part of the second pins PI2 and the chip CH through a plurality of bumps, so as to form a flip-chip light emitting diode package structure. For example, the bumps may be disposed on the controller 120 and the second pins PI2, and the chip CH may be connected with the bumps by soldering, thereby electrically connecting the chip CH, the controller 120, and the second pins PI2.

In view of the foregoing, with the second pins electrically separated from each other, the lead frame unit according to the embodiments of the invention is suitable for electrical testing to grade the lead frame units carrying the controllers. Thus, the electrical property of each of the lead frame units carrying the controllers in the lead frame may be properly evaluated and selected, so that the lead frame units may be used with the suitable chips based on practical needs to thereby improve the yield rate of the subsequent processes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A carrier array for carrying a plurality of chips, the carrier array comprising:
   a lead frame comprising a frame body and a plurality of lead frame units, wherein the plurality of lead frame units is connected with each other through the frame body and arranged in an array, each of the plurality of lead frame units comprises at least one first pin connected with the frame body and a plurality of second pins separated from each other, and the plurality of second pins is not connected with the frame body;
   at least one controller disposed on each of the plurality of lead frame units, wherein the at least one controller is electrically connected with one of the plurality of lead frame units correspondingly, and the at least one controller is electrically connected with one of the plurality of chips in series correspondingly through one of the plurality of second pins; and
   a plurality of first packages disposed on the lead frame, wherein each of the plurality of first packages corresponds to and encapsulates one of the plurality of lead frame units and the at least one controller disposed thereon, each of the plurality of first packages has an opening to expose a portion region of the corresponding lead frame unit, and the opening is adapted to accommodate at least one of the plurality of chips.

2. The carrier array as claimed in claim 1, wherein each of the plurality of first packages encapsulates a portion region of the corresponding plurality of second pins, and the plurality of second pins is fixed on the frame body through the plurality of first packages.

3. The carrier array as claimed in claim 1, wherein the plurality of second pins of each lead frame unit extends from inside of the corresponding first package to outside of the corresponding first package and is exposed by the corresponding opening.

4. The carrier array as claimed in claim 1, wherein the plurality of second pins of each lead frame unit is floated in the corresponding first package.

5. The carrier array as claimed in claim 1 further comprising:
   a plurality of bonding wires, wherein the at least one controller is electrically connected with at least a part of the plurality of second pins through the plurality of bonding wires.

6. The carrier array as claimed in claim 1 further comprising:
   a plurality of conductive bumps, wherein the at least one controller is electrically connected with at least a part of the plurality of second pins through the plurality of conductive bumps.

7. The carrier array as claimed in claim 1, wherein each of the plurality of chips is electrically connected with one of the plurality of lead frame units correspondingly, and the carrier array further comprises:
   a plurality of second packages, each of the plurality of second packages being respectively disposed in one of the plurality of openings and encapsulating one of the plurality of chips.

8. A light emitting diode package structure, comprising:
   a lead frame unit comprising at least one first pin and a plurality of second pins separated from each other;
   at least one controller disposed on the lead frame unit, wherein the at least one controller is electrically connected with the plurality of second pins of the lead frame unit;
   a first package disposed on the lead frame unit, wherein the first package encapsulates the lead frame unit and the at least one controller, and the first package has an opening to expose a portion region of the lead frame unit; and
   at least one chip disposed in the opening, wherein the at least one chip is electrically connected with the at least one first pin and a part of the plurality of second pins of the lead frame unit, and at least one controller is connected with the at least one chip in series correspondingly through one of the plurality of second pins.

9. The light emitting diode package structure as claimed in claim 8, wherein the first package encapsulates a portion region of each of the plurality of second pins, and the plurality of second pins is fixed to the lead frame unit through the first package.

10. The light emitting diode package structure as claimed in claim 8, wherein the plurality of second pins extends from inside of the first package to outside of the first package and are exposed by the opening.

11. The light emitting diode package structure as claimed in claim 8, further comprising:
    a second package, the second package being disposed in the opening and encapsulating the at least one chip.

12. A carrier array, comprising:
    a lead frame comprising a frame body and a plurality of lead frame units, wherein the plurality of lead frame units is connected with each other through the frame body and arranged in an array, each of the plurality of lead frame units comprises at least one first pin connected with the frame body and a plurality of second pins separated from each other, and the plurality of second pins is not connected with the frame body;
    a plurality of controllers and a plurality of chips disposed on each of the plurality of lead frame units, wherein the plurality of controllers is electrically connected with one of the plurality of lead frame units correspondingly, and the plurality of controllers is electrically connected with the plurality of chips in series through the plurality of second pins; and
    a plurality of first packages disposed on the lead frame, wherein the plurality of first packages corresponds to and encapsulates the plurality of lead frame units and the plurality of controllers disposed thereon, each of the plurality of first packages has an opening to expose a portion region of the corresponding lead frame unit, and the opening is adapted to accommodate the plurality of chips.

* * * * *